United States Patent
Easter et al.

(10) Patent No.: US 6,596,639 B1
(45) Date of Patent: Jul. 22, 2003

(54) METHOD FOR CHEMICAL/MECHANICAL PLANARIZATION OF A SEMICONDUCTOR WAFER HAVING DISSIMILAR METAL PATTERN DENSITIES

(75) Inventors: William G. Easter, Orlando, FL (US); Sudhanshu Misra, Orlando, FL (US); Vivek Saxena, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/415,529

(22) Filed: Oct. 8, 1999

(51) Int. Cl.[7] .............................................. H01L 21/302
(52) U.S. Cl. ...................... 438/692; 438/626; 438/633; 438/699
(58) Field of Search ........................ 438/626, 631–634, 438/645, 692

(56) References Cited

U.S. PATENT DOCUMENTS 5,516,729 A * 5/1996 Dawson et al. ............. 438/623
5,866,945 A * 2/1999 Chen et al. ................. 257/750
5,893,750 A * 4/1999 Hause et al. ................ 438/633

FOREIGN PATENT DOCUMENTS

JP           10-135209      * 5/1998

* cited by examiner

Primary Examiner—Wael Fahmy
Assistant Examiner—Marcos D. Pizarro-Crespo

(57) ABSTRACT

The present invention provides a method of manufacturing an integrated circuit including planarizing a semiconductor wafer surface. In one embodiment, the method comprises forming a dielectric layer over a first level having an irregular topography, depositing a sacrificial material over the dielectric layer, and then planarizing the semiconductor wafer surface to a planar surface. More specifically, the dielectric layer forms such that it substantially conforms to the irregular topography of the first level. The sacrificial material is formed to a substantially planar surface over the dielectric layer. Thus, the sacrificial material provides a substantially uniform chemical/mechanical planarization (CMP) process removal rate across the semiconductor wafer surface. In the ensuing step, planarizing the semiconductor wafer surface to a planar surface removes the sacrificial material and a portion of the dielectric layer with a CMP process.

14 Claims, 4 Drawing Sheets

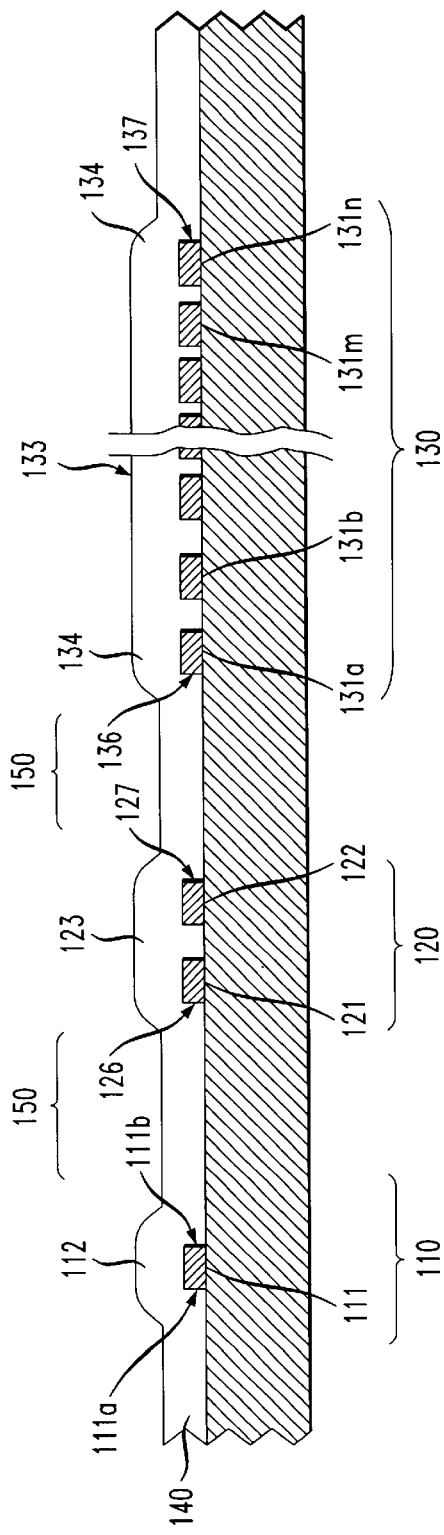
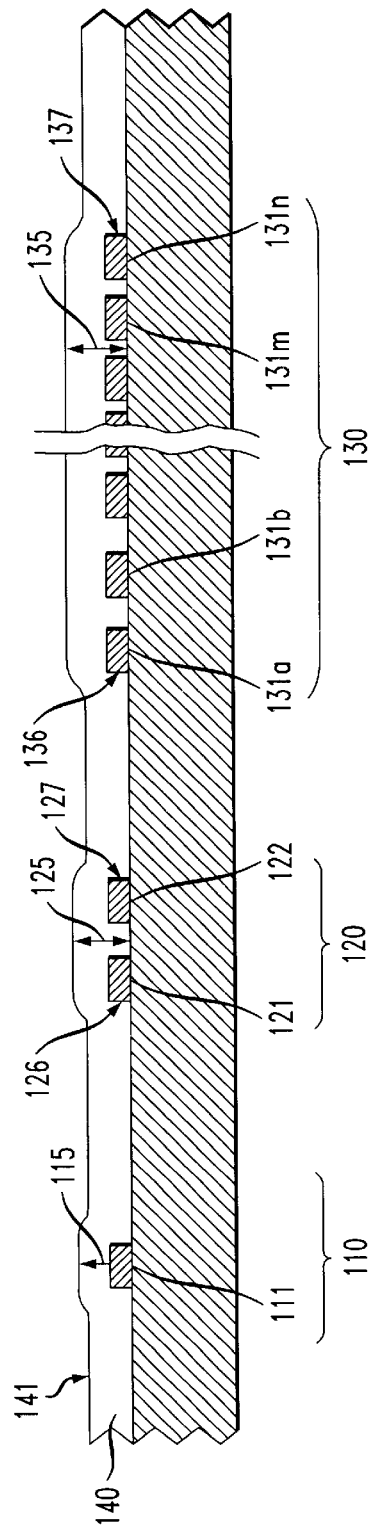

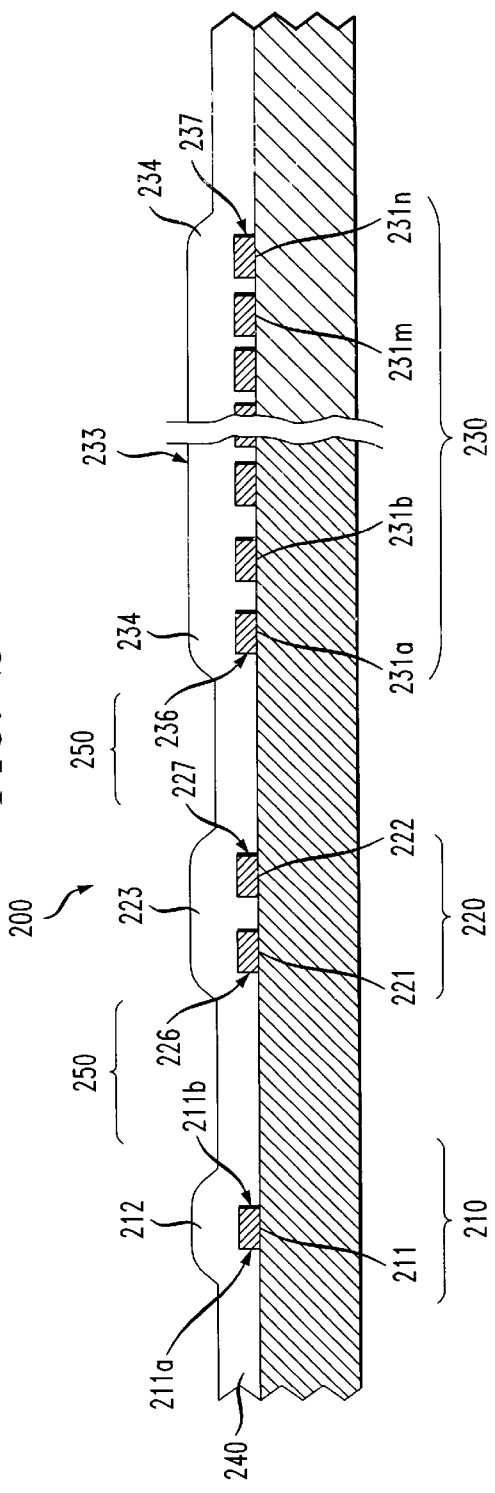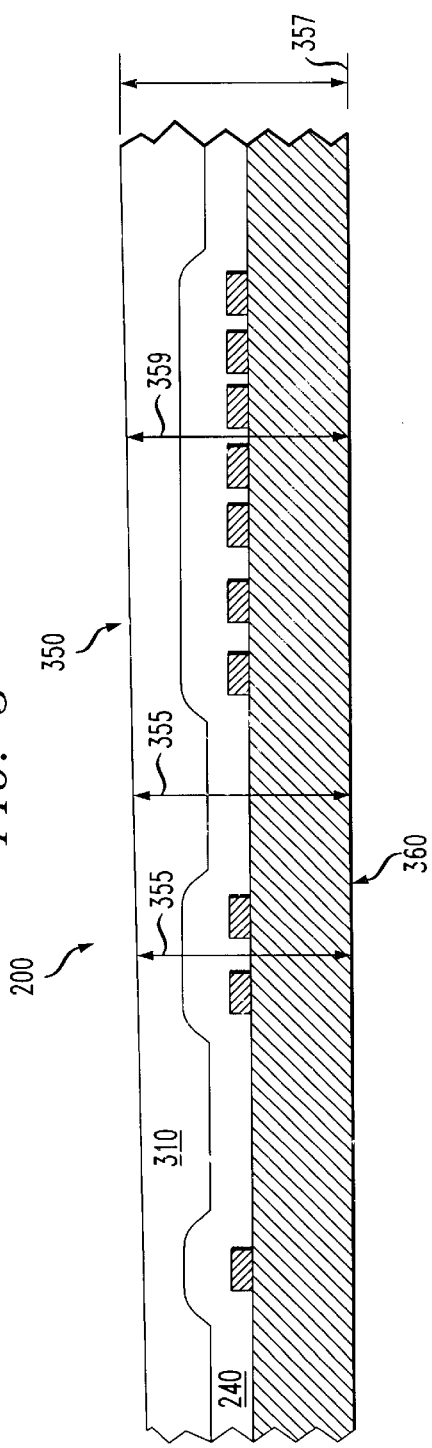

METHOD FOR CHEMICAL/MECHANICAL PLANARIZATION OF A SEMICONDUCTOR WAFER HAVING DISSIMILAR METAL PATTERN DENSITIES

TECHNICAL FIELD OF THE INVENTION

The present invention is directed, in general, to semiconductor manufacturing and, more specifically, to a method involving applying a sacrificial material to a substantially planar condition prior to planarizing a semiconductor wafer having an interlayer dielectric over dissimilar metal pattern density areas.

BACKGROUND OF THE INVENTION

Dielectric and metal layers used in chip fabrication today must be made extremely flat and of precise thickness in order to photolithographically pattern the sub-micron sized features that comprise a semiconductor device. During chemical/mechanical planarization (CMP), the combination of chemical etching and mechanical abrasion produces the required flat, precise surface for subsequent depositions.

Commonly, the functional complexity of the circuits with shrinking dimensions is limited by the characteristics of the metallic conductors (commonly referred to as interconnects) that provide the electrical connections between the circuit elements. Key characteristics considered when employing such interconnects are the minimum width and separation of the conductor features as well as the total number of interconnect levels that are required. The non-planarity of the top surface of an integrated circuit is determined by the cumulative non-planarity of all the underlying levels. Therefore, as the number of underlying interconnect levels is increased, the planarization precision at each level becomes more important as errors are cumulative to the uppermost level. For a more thorough discussion of planarization and the effects of non-planarity on photolithography, see S. Wolf's, *Silicon Processing for the VLSI Era, Vol. 2*, which is incorporated herein by reference.

CMP preferentially removes the high portions of whatever layer is being planarized. In many instances, the layer is an interlayer dielectric (ILD) that occurs in areas directly above underlying interconnect topography. During deposition, the ILD follows the general contours of the previous layer, such that relatively complex interconnect areas have resultant large contiguous dielectric deposition thereon. That is, during deposition the dielectric "mushrooms" around each feature as the feature acts like a stem of a mushroom. Referring initially to FIGS. 1A–1B, illustrated are sectional views of a conventional planarization process. FIG. 1A illustrates a sectional view of three different areas of interconnect pattern density 110, 120, 130 with a dielectric layer 140 deposited thereon. Pattern density is defined, for this discussion, as the normalized percentage of the total surface area of a substrate that is covered with interconnects. For example, pattern density may be expressed as the percentage of metal interconnect area per surface area. Thus, closely spaced interconnects will have a higher pattern density. With a single interconnect 111, the dielectric 140 forms a mushroom 112 about the single interconnect 111 that is essentially equal on each side 111a, 111b of the interconnect 111. When dual interconnects 121, 122 are sufficiently close, a mushroom 123 extends to either side of the outermost interconnect sides 126, 127. In the case of a plurality of conventional interconnect structures (designated as 131a–131n), the dielectric layer 140 forms such that the surface 133 over the interconnects 131a–131n is essentially planar, while the mushroom 134 forms beyond outer edges 136 and 137 of the outermost interconnects 131a, 131n. As can be seen, between areas 110, 120, and 130, valleys 150 occur in the dielectric 140 where interconnects do not exist.

FIG. 1B illustrates the results of a CMP process performed on the interconnect densities of FIG. 1A. During the CMP process, the dielectric removal rate is slower for regions with a high density 130 of underlying interconnect structures because a large fraction of the wafer surface contacts the polishing pad in these regions. One who is skilled in the art is familiar with conventional CMP processes. Conversely, areas of low pattern interconnect density 110, 120 encounter significantly faster removal of material during CMP. Consequently, the height of the dielectric layer 140 may vary dramatically across the chip depending on the underlying metal pattern density. While the surface 141 of the dielectric layer 140 is locally planar, the pattern density variation in the underlying interconnect structures 110, 120, 130 creates an unacceptable amount of non-planarity in the dielectric surface 141 as indicated by the variation in the dielectric layer thicknesses 115, 125, 135 in different areas of the die. Following the CMP process, thicknesses 115, 125, 135 will vary, such that: thickness 115 is less than thickness 125, is less than thickness 135. Therefore, the desired planarity is jeopardized.

One approach that has been taken to compensate for this problem is termed metal topography reduction (MTR), which is discussed in U.S. patent application Ser. No. 09/298,792 filed on Apr. 23, 1999 entitled "Method of Planarizing a Surface of an Integrated Circuit" which is incorporated herein by reference. This involves forming a photoresist material over selected recessed areas of a die such as the valleys 150 of FIG. 1A, etching the photoresist, and then partially etching into protruding areas 112, 123, 133 to roughly level the die surface. The semiconductor die are then conventionally planarized. Of course, this introduces an additional photolithographic step and a plasma etch of the dielectric to reduce the area of the dielectric in those areas with a high area density of metal. This somewhat reduces the effects of the higher and lower pattern densities. While some success has been achieved with metal topography reduction, the additional photolithographic and etching steps are both expensive and time consuming.

Accordingly, what is needed in the art is an inexpensive method of preparing a semiconductor wafer for chemical/mechanical planarization of the interlayer dielectric.

SUMMARY OF THE INVENTION

To address the above-discussed deficiencies of the prior art, the present invention provides a method of manufacturing an integrated circuit including planarizing an irregular semiconductor wafer surface. In one embodiment, the method comprises forming an interlayer dielectric over a first level having an irregular topography, depositing a sacrificial material over the dielectric layer, and then planarizing the semiconductor wafer surface to a planar surface. More specifically, the dielectric layer forms such that it substantially conforms to the irregular topography of the first level. The sacrificial material is formed to a substantially planar surface over the dielectric layer. Thus, the sacrificial material provides a substantially uniform chemical/mechanical planarization (CMP) process removal rate across the semiconductor wafer surface. In the ensuing step, planarizing the semiconductor wafer surface to a planar surface removes the sacrificial material and a portion of the dielectric layer with the CMP process.

Thus, in a-broad aspect, a sacrificial material is deposited upon an interlayer dielectric that has conformed to an underlying, irregular topography. The sacrificial material forms a substantially planar surface over the irregular topography, and it has a CMP process removal rate substantially equal to the removal rate of the dielectric layer. For this discussion, a substantially planar surface is a surface where the difference between the highest and lowest points is no greater than about 15 percent to 20 percent of the thickness as measured from a datum plane. Therefore, in the immediately ensuing step of planarizing, the dielectric layer and sacrificial material are removed at substantially the same rate, resulting in a planar surface. A planar surface, for this discussion, is a surface where the difference between the highest and lowest points is less than about 10 percent of the thickness as measured from the same datum plane, rather than absolutely planar.

In an alternative embodiment, the method includes forming a dielectric layer that substantially conforms to an irregular topography comprising a lower pattern density region and a higher pattern density region. In this instance, the dielectric layer has a higher CMP process removal rate over the lower pattern density region than over the higher pattern density region. Planarizing, in another embodiment, includes removing essentially all of the sacrificial material and at least a portion of the dielectric layer.

In another embodiment, the method includes depositing a spin-on material. In a further aspect, the method includes depositing a spin-on material having a selectivity substantially equal to a selectivity of the dielectric layer. Specifically, the sacrificial material may be: methylsiloxane, fluorinated silicon glass, or phosphosilicate glass. Alternatively, the sacrificial material may be inorganic spin-on polymer such as polyperhydrido siloxane or hydrogen-silsesquioxane $(HSiO_{3/2})_n$. In yet another embodiment, the method includes forming an interlayer dielectric having a selectivity greater or less than about 1:1 and varying a thickness of the spin-on material to compensate for the selectivity being greater or less than about 1:1. Selectivity, for the purposes of this discussion, is the ratio of the removal rate of one material to that of another standard material under the same conditions. In a particularly advantageous embodiment, the method includes forming an interlayer dielectric having a selectivity of about 1:1 to the sacrificial layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 1A illustrates a sectional view of three different areas of interconnect pattern density with a dielectric layer deposited thereon FIG. 1B illustrates the results of a CMP process performed on the interconnect densities of FIG. 1A;

FIG. 2 illustrates a sectional view of a simplified semiconductor wafer having three different areas of interconnect pattern density with a conventional interlayer dielectric deposited thereon;

FIG. 3 illustrates a sectional view of the semiconductor wafer of FIG. 2 after deposition of a sacrificial material upon the interlayer dielectric;

DETAILED DESCRIPTION

Figure 4:
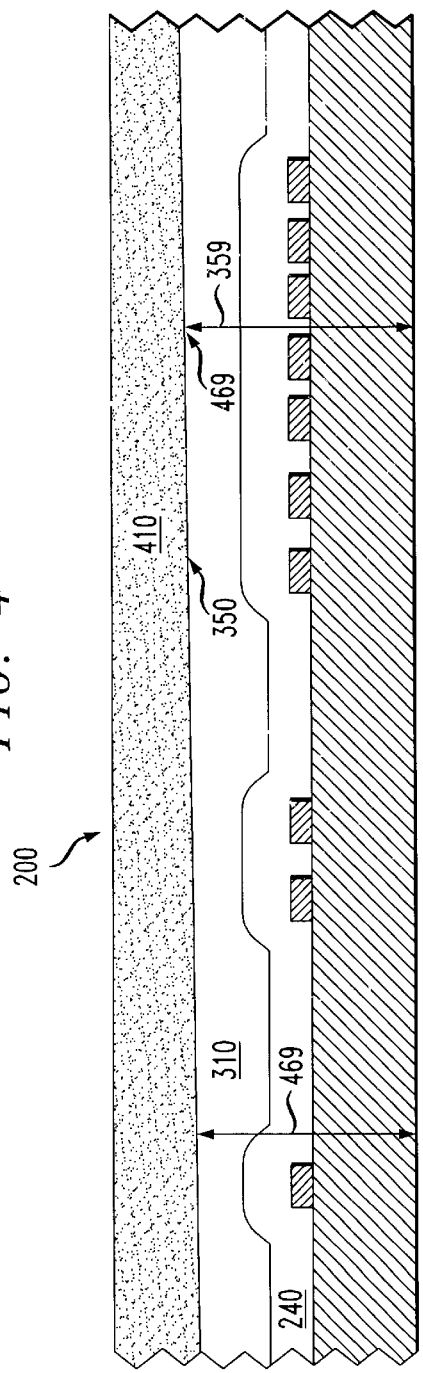
FIG. 4 illustrates a sectional view of the semiconductor wafer 200 of FIG. 3 as planarization begins.

Referring now to FIG. 2, illustrated is a sectional view of a simplified semiconductor wafer 200 having three different areas of interconnect pattern density 210, 220, 230 with a conventional interlayer dielectric 240 deposited thereon. For this discussion, pattern density is defined as the normalized percentage of the total surface area of a substrate that is covered with interconnects, that is: the percentage of metal interconnect area per surface area. The area may be expressed in any units suitable for the semiconductor in question, i.e., $mm^2$, etc. Thus, closely spaced interconnects will have a higher pattern density. The sectional view is termed "simplified" because lower levels of semiconductor structure, such as gates, sources, drains, etc., have been omitted for clarity as they do not affect the present discussion.

The first pattern density area 210, exemplifying a very low pattern density, has a single interconnect 211 around which the interlayer dielectric 240 forms a mushroom 212. The mushroom 212 forms essentially equally on sides 211a, 211b of the interconnect 211. In the second pattern density area 220, dual interconnects 221, 222 are sufficiently close that a mushroom 223 extends to either side of the outermost interconnect sides 226, 227. The third pattern density area 230, exemplifying a very high pattern density, comprises a plurality of conventional interconnect structures (designated as 231a–231n). In this instance, the dielectric layer 240 forms an essentially planar surface 233 over the interior interconnects 231b–231m. The mushroom 234 forms beyond outer edges 236 and 237 of the outermost interconnects 231a, 231n. Valleys 250 occur in the interlayer dielectric 240 between areas 210, 220, and 230 where interconnects do not exist. Each material used for an interlayer dielectric 240 has a selectivity value associated therewith. Selectivity is defined, for this discussion, as the polish rate of one material divided by the polish rate of a comparison material under the same conditions and as such is dimensionless.

Referring now to FIG. 3, illustrated is a sectional view of the semiconductor wafer 200 of FIG. 2 after deposition of a sacrificial material 310 upon the interlayer dielectric 240. The sacrificial material 310 may be applied by spin-on techniques employing a material that has a selectivity substantially equal to the selectivity of the interlayer dielectric 240. In one advantageous embodiment, the selectivity of the sacrificial material 310 is about 1:1. Specific materials that may be used in the spin-on deposition include: methylsiloxane, fluorinated silicon glass, or phosphosilicate glass. Alternatively, an inorganic spin-on polymer such as polyperhydrido siloxane or hydrogen-silsesquioxane $(HSiO_{3/2})_n$ may also be used as the sacrificial spin-on material. Of course, other spin-on materials may also be used if they have acceptable selectivities. The sacrificial spin-on material 310 is deposited until a substantially planar surface 350 results. A substantially planar surface 350, for this intermediate state, is defined as one in which any height 355 of the substantially planar surface 350 above a datum plane 357, e.g., a back 360 of the semiconductor wafer 200, varies by no more than about 15 percent to 20 percent of a maximum height 359 of the substantially planar surface 350.

The next process for the semiconductor wafer 200 after spin-on deposition is planarization without intervening steps, e.g., etching, masking, etc. Referring now to FIG. 4, illustrated is a sectional view of the semiconductor wafer 200 of FIG. 3 as planarization begins. In the illustrated embodiment, planarization begins with a polishing pad 410 conforming to the substantially planar surface 350 of the sacrificial material 310. Planarization proceeds, and a major portion of the sacrificial material 310 is removed. During this phase, the selectivity in effect is that of the sacrificial material 310, and high spots 459 are removed. Because the variation between a maximum height 359 and a minimum height 469 is no more than about 15 percent to 20 percent of the maximum height 359, during polishing the maximum height 359 is slowly reduced to approximately the minimum height 469. Thus, minor high spots 459 on the sacrificial material 310 have been reduced prior to the polishing pad 410 contacting the interlayer dielectric 240.

In an alternative embodiment when the selectivity of the interlayer dielectric 240 cannot be exactly matched, the thickness of the sacrificial material 310 may be adjusted to compensate for a greater or less than 1:1 selectivity between the interlayer dielectric 240 and the spin-on material 310.

Figure 5:
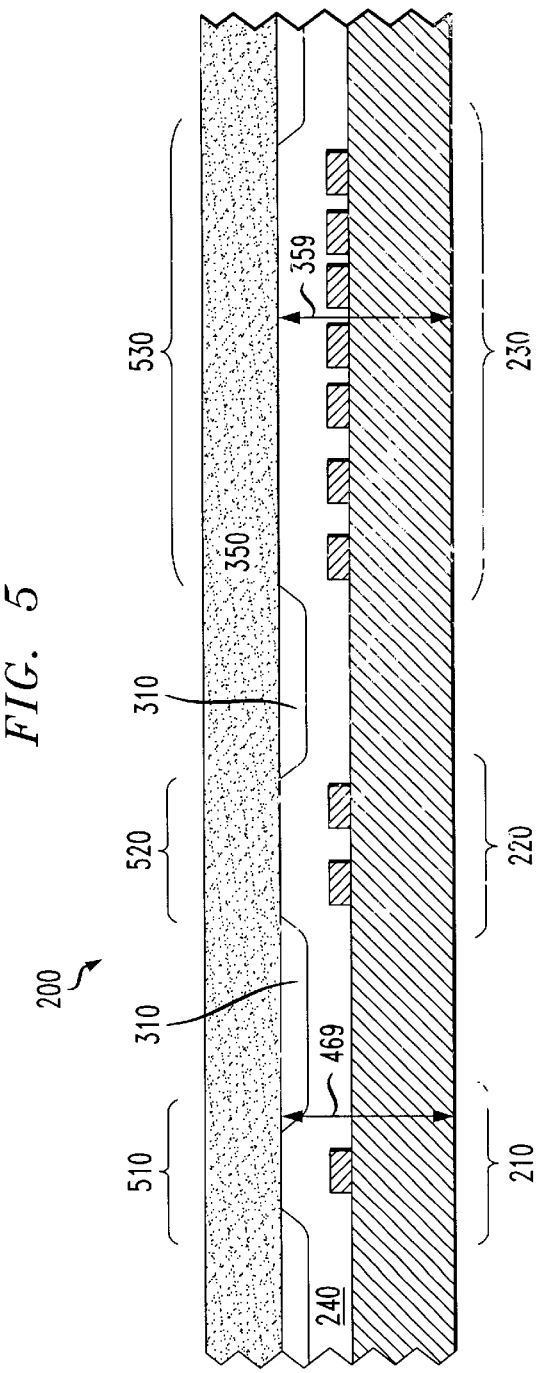
FIG. 5 illustrates a sectional view of the semiconductor wafer of FIG. 4 as planarization of the interlayer dielectric begins.

Referring now to FIG. 5, illustrated is a sectional view of the semiconductor wafer 200 of FIG. 4 as planarization of the interlayer dielectric 240 begins. It is important to note that, at this time, the selectivity of the sacrificial material 310 and the selectivity of the interlayer dielectric 240 are substantially equal. Therefore, the CMP process affects both the sacrificial material 310 and the interlayer dielectric 240 approximately uniformly across the wafer 200. That is, material removal of the sacrificial material 310 and the interlayer dielectric 240 is substantially uniform. Therefore, material removal in regions 530 over high pattern density areas 230 are removed at the same rate as regions 510, 520 over low pattern density areas 210, 220.

Figure 6:
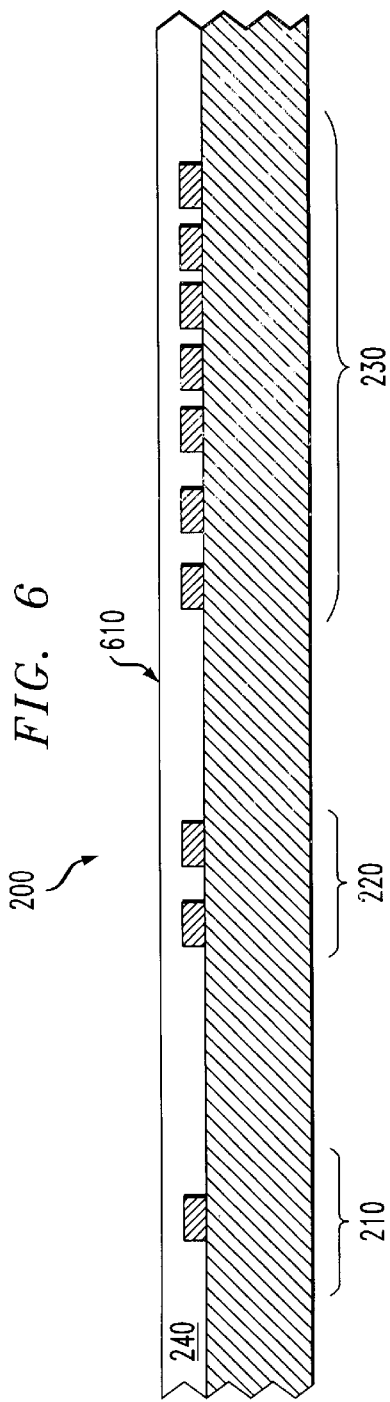
FIG. 6 illustrates a sectional view of the semiconductor wafer of FIG. 5 after completing planarization.

Referring now to FIG. 6 with continuing reference to FIG. 5, illustrated is a sectional view of the semiconductor wafer 200 of FIG. 5 after completing planarization. Because the removal rate for the sacrificial material 310 and the interlayer dielectric 240 was substantially equal, it was possible to planarize the intermediate layer dielectric 240. Planarized, for this discussion, is the condition such that for any point on a surface 610 of the wafer 200, there is a variation of no more than about 10 percent of the maximum height between the lowest point on the wafer 200 and the highest point on the wafer 200.

Figure 7:
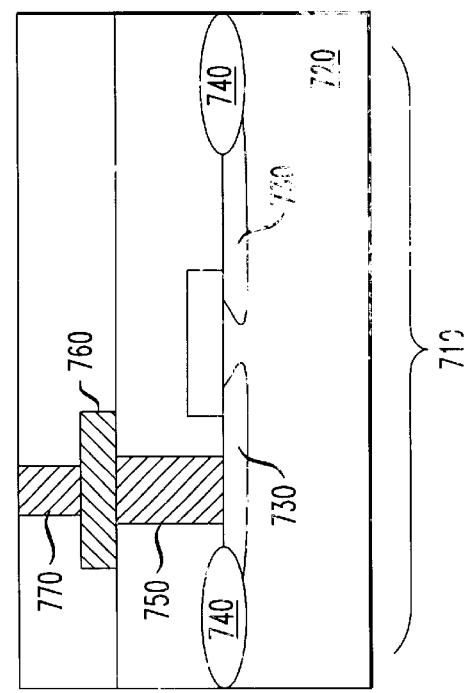
FIG. 7 illustrates a partial sectional view of a conventional integrated circuit that can be manufactured using a method for planarizing a semiconductor wafer surface in accordance with the principles of the present invention.

Referring now to FIG. 7, illustrated is a partial sectional view of a conventional integrated circuit 700 that can be manufactured using a method for planarizing a semiconductor wafer surface in accordance with the principles of the present invention. In this particular sectional view, there is illustrated an active device 710 that comprises a tub region 720, source/drain regions 730 and field oxides 740, which together may form a conventional transistor, such as a CMOS, PMOS, NMOS or bi-polar transistor. A contact plug 750 contacts the active device 710. The contact plug 750 is, in turn, contacted by a trace 760 that connects to other regions of the integrated circuit, which are not shown. A VIA 770 contacts the trace 760, which provides electrical connection to subsequent levels of the integrated circuit.

Thus, a method for planarizing a semiconductor wafer surface having an irregular interlayer dielectric topography has been described. The method involves depositing a spin-on layer of a sacrificial material having a selectivity substantially equal to the selectivity of the interlayer dielectric. The spin-on layer is deposited to a substantially planar state, and planarization begins directly following that deposition. Photomasks, etching, etc. are thereby avoided. Planarization proceeds until all of the sacrificial material has been removed and a portion of the dielectric layer. The result is a planarized surface that has no more than a 10 percent variation of wafer thickness across the wafer.

Although the present invention has been described in detail, those skilled in the art should understand that they can make various changes, substitutions and alterations herein without departing from the spirit and scope of the invention in its broadest form.

What is claimed is:

1. A method for planarizing a semiconductor wafer surface, comprising:

forming a dielectric layer over a first level having an irregular topography, said dielectric layer substantially conforming to said irregular topography;

depositing a sacrificial material over said dielectric layer, said sacrificial material forming a substantially planar surface and having a chemical/mechanical planarization (CMP) process removal rate substantially equal to a CMP process removal rate of said dielectric layer, wherein said CMP process removal rates of said sacrificial material and said dielectric layer provide a substantially uniform CMP process removal rate across a semiconductor wafer surface; and then planarizing said semiconductor wafer surface to a planar surface by removing said sacrificial material and a portion of said dielectric layer with a CMP process.

2. The method as recited in claim 1 wherein forming includes forming a dielectric layer over a first level having an irregular topography, said irregular topography comprising a lower pattern density region and a higher pattern density region, said dielectric layer having a higher CMP process removal rate over said lower pattern density region than over said higher pattern density region.

3. The method as recited in claim 1 wherein planarizing includes removing essentially all of said sacrificial material and at least a portion of said dielectric layer.

4. The method as recited in claim 1 further comprising varying a thickness of said sacrificial material to compensate for a difference between said CMP process removal rate of said sacrificial material and said CMP process removal rate of said dielectric layer.

5. The method as recited in claim 1 wherein depositing includes depositing a spin-on material.

6. The method as recited in claim 5 wherein depositing includes depositing a sacrificial material selected from the group consisting of:

methyl siloxane;

fluorinated silicon glass; and phosphosilicate glass.

7. The method as recited in claim 5 wherein depositing includes depositing an inorganic spin-on polymer selected from the group consisting of:

polyperhydrido siloxane; and hydrogen-silsesquioxane $(HSiO_{3/2})_n$.

8. A method for manufacturing an integrated circuit, comprising:

forming active devices on a semiconductor wafer surface;

forming a first level interconnecting said active devices and having an irregular topography over said active devices;

forming an interlayer dielectric over said first level, said interlayer dielectric substantially conforming to said irregular topography;

depositing a sacrificial material over said dielectric layer, said sacrificial material forming a substantially planar surface and having a chemical/mechanical planarization (CMP) process removal rate substantially equal to a CMP process removal rate of said dielectric layer, wherein said CMP process removal rates of said sacrificial material and said dielectric layer provide a substantially uniform CMP process removal rate across a semiconductor wafer surface; and then planarizing said semiconductor wafer surface to a planar surface by removing said sacrificial material and a portion of said interlayer dielectric with a CMP process.

9. The method as recited in claim 8 wherein forming an interlayer dielectric includes forming an interlayer dielectric, said irregular topography comprising a lower pattern density region and a higher pattern density region, said interlayer dielectric having a higher CMP process removal rate over said lower pattern density region than over said higher pattern density region.

10. The method as recited in claim 8 wherein planarizing includes removing essentially all of said sacrificial material and at least a portion of said interlayer dielectric.

11. The method as recited in claim 8 further comprising varying a thickness of said sacrificial material to compensate for a difference between said CMP process removal rate of said sacrificial material and said CMP process removal rate of said dielectric layer.

12. The method as recited in claim 8 wherein depositing includes depositing a spin-on material.

13. The method as recited in claim 12 wherein depositing includes depositing a sacrificial material selected from the group consisting of:

methyl siloxane;

fluorinated silicon glass; and phosphosilicate silicon glass.

14. The method as recited in claim 12 wherein depositing includes depositing an inorganic spin-on polymer selected from the group consisting of:

polyperhydrido siloxane; and hydrogen-silsesquioxane $(HSiO_{3/2})_n$.

* * * * *